United States Patent [19]

Matsumae et al.

[11] Patent Number: 4,737,383
[45] Date of Patent: Apr. 12, 1988

[54] METHOD AND APPARATUS FOR MANUFACTURING RESIN-IMPREGNATED SHEET MATERIAL

[75] Inventors: Toshiyuki Matsumae; Kunji Nakashima, both of Osaka; Hajime Kojima, Hirakata, all of Japan

[73] Assignee: Matsushita Electric Works, Ltd., Osaka, Japan

[21] Appl. No.: 879,620

[22] Filed: Jun. 27, 1986

[30] Foreign Application Priority Data

Nov. 25, 1985 [JP] Japan .................................. 60-264450

[51] Int. Cl.⁴ .......................... B05D 1/18; B05D 3/00; B05C 3/12; C23C 14/00
[52] U.S. Cl. ..................................... 427/294; 118/50; 118/419; 118/424; 427/296; 427/434.2; 427/434.7
[58] Field of Search ................. 118/50, 50.1, 419, 420, 118/424; 427/294, 296, 299, 322, 434.2, 434.6, 434.7

[56] References Cited

U.S. PATENT DOCUMENTS

3,848,439 11/1974 Lopata .............................. 118/50 X
4,590,099 5/1986 Reith .................................. 118/50 X Primary Examiner—Michael R. Lusignan
Attorney, Agent, or Firm—Burns, Doane, Swecker & Mathis

[57] ABSTRACT

A resin-impregnated sheet material is manufactured by passing a sheet material through a vacuum space of a reduced pressure sufficiently different from ambient atmospheric pressure for sufficiently deaerating the sheet material at the vacuum space, and impregnating the thus deaerated sheet material with a resin varnish while utilizing the pressure difference between the atmosphere and the vacuum space, the sufficiently deaerated sheet material being impregnated quickly and reliably with the resin varnish to provide the resin-impregnated sheet material of high quality.

18 Claims, 7 Drawing Sheets

METHOD AND APPARATUS FOR MANUFACTURING RESIN-IMPREGNATED SHEET MATERIAL

TECHNICAL BACKGROUND OF THE INVENTION

This invention relates to methods and apparatuses for manufacturing resin-impregnated sheet materials and, more specifically, to such method and apparatus that gas present in voids within a fibrous sheet material is expelled from the sheet in a vacuum space and the gas-expelled sheet is then uniformly impregnated with a resin varnish to manufacture a resin-impregnated sheet material.

A resin-impregnated sheet material prepared in the manner referred to can be of high quality without any voids by sufficiently deaerating the sheet material and then impregnating the deaerated sheet with the resin varnish, to be effectively utilizable as laminating material for a high quality printed wiring board or the like.

DISCLOSURE OF PRIOR ART

Disclosed in U.S. Pat. No. 3,848,439 to K. P. Lopata is an example of known apparatuses in which, generally, the fibrous sheet material is passed through the vacuum space and is impregnated with any liquid. In this impregnating apparatus, a vacuum unit is provided in association with a dip roller partly immersed in the impregnating liquid, and this vacuum unit comprises a hood which is arcuate in side elevation to extend along part of the circumference of the dip roller. The hood itself is opened toward the dip roller, and is provided at its inlet and outlet ends with endless resilient sealing bands supported by a hollow rim-shaped holder for abutting against the dip roller. In this case, the sheet material in a strip shape is fed between the dip roller and the vacuum unit to be deaerated, and then the deaerated strip is guided into a liquid bath in which the dip roller is partly immersed to be impregnated with the liquid and is thereafter led out of the bath.

However, such impregnating apparatus involves a problem that in, as the resilient sealing bands must be forcibly brought into engagement with the dip roller to form a sufficient vacuum space between the dip roller and the vacuum unit, the resilient sealing band specifically disposed at the inlet end of the hood is subjected to a high pressing force due to its location between the atmosphere and the vacuum space, so as to be quickly worn out or deteriorated in the resiliency. Such wearing of sealing band at the inlet end causes the air tightness of the vacuum space to be reduced and the intended deaeration to be insufficient, and it becomes difficult to obtain a high quality resin-impregnated sheet material. Furthermore, the forcible engagement of the resilient sealing bands of the vacuum unit against the dip roller renders the sheet material to be susceptible to damages.

TECHNICAL FIELD OF THE INVENTION

A primary object of the present invention is, therefore, to provide a manufacturing method and apparatus in which a sheet material can be fed into a vacuum space without being caused to be damaged and can be sufficiently deaerated to be substantially completely impregnated with resin varnish, to be a high quality resin-impregnated sheet material.

According to the present invention, this object is realized by a method of manufacturing a resin-impregnated sheet material wherein an airtight vacuum space having inlet and outlet means is prepared for introducing therein and thereout a sheet material, the sheet material is passed through the vacuum space to be deaerated, and the deaerated sheet is passed through a resin-varnish impregnating means to be impregnated with resin varnish to a high rate, wherein a pressure of the vacuum space is reduced to be sufficiently different from the ambient atmospheric pressure of the vacuum space for achieving a high rate deaeration of the sheet material, and the deaerated sheet material is passed through the vacuum space to be impregnated with a resin varnish, utilizing the difference between the ambient atmospheric pressure and the pressure in the vacuum space.

In the present invention employing this arrangement, the sheet material is sufficiently deaerated to be impregnated with the resin varnish at a high density, and a difference between the pressure of the vacuum space and the ambient pressure is suitably set depending on the sort of the sheet material, to realize a more complete deaeration of the sheet and to contribute to the provision of a high quality of resin-impregnated sheet material.

Other objects and advantages of the present invention shall be made clear in the following description of the invention detailed with reference to preferred embodiments shown in accompanying drawings.

While the present invention shall now be described with reference to the preferred embodiments shown in the drawings, it should be understood that the intention is not to limit the invention only to the particular embodiments shown but rather to cover all alterations, modifications and equivalent arrangements possible within the scope of appended claims.

DISCLOSURE OF PREFERRED EMBODIMENTS

Figure 1:
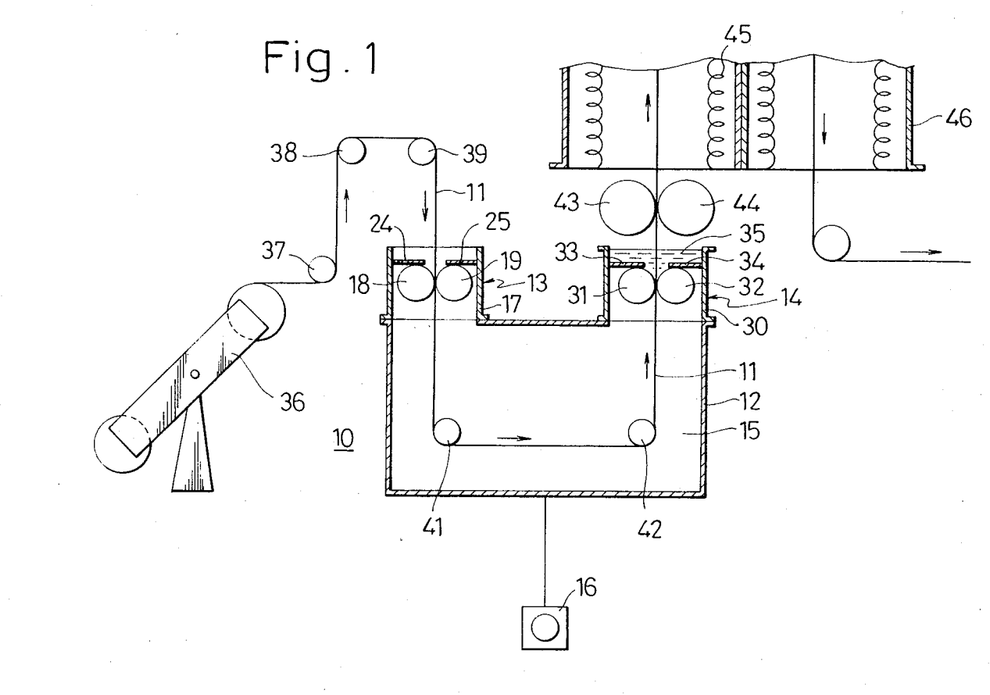
FIG. 1 is a schematic diagram of an embodiment of showing an apparatus for manufacturing the resin-impregnated sheet material in an embodiment according to the present invention, in which a resin-varnish impregnating means is provided at outlet part of the apparatus.
Figure 2:
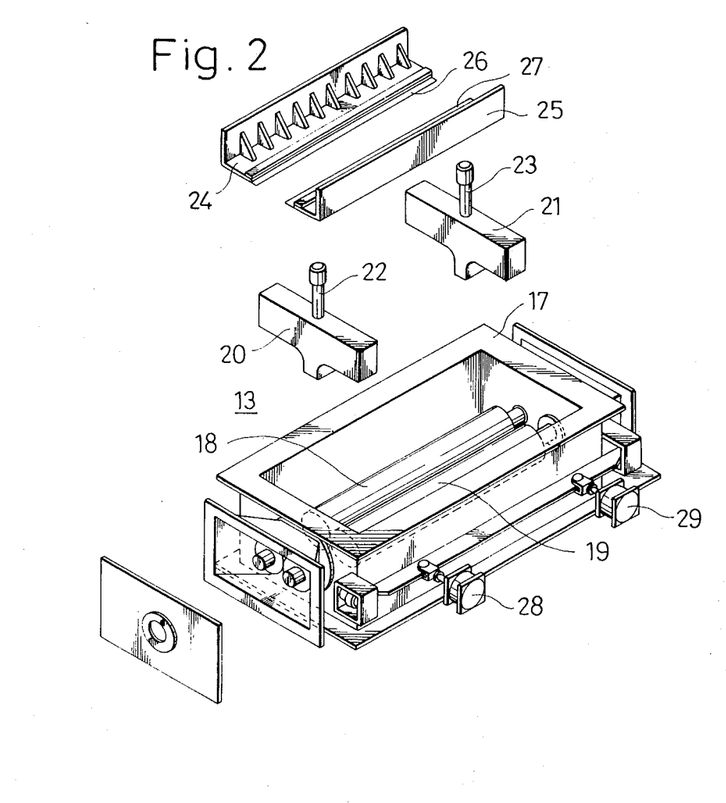
FIG. 2 is an exploded perspective view of an inlet unit of a vacuum chamber in the manufacturing apparatus of FIG. 1.

Referring to FIGS. 1 and 2, an apparatus 10 for manufacturing a resin-impregnated sheet material according to an embodiment of the present invention comprises a vacuum chamber 12 through which a strip material 11 is passed. The vacuum chamber 12 is provided with mutually independent inlet and outlet units 13 and 14 which airtightly lead the sheet material 11 respectively into and out of the vacuum chamber 12, so as to be highly airtight as a whole, and a vacuum space 15 is defined therein. The vacuum chamber 12 is coupled to a vacuum pump 16 for reducing air pressure in the vacuum space 15 of the chamber 12 to a desired level at which an effective pressure difference is achieved between the vacuum space, 15 and the ambient atmosphere of the vacuum chamber 12 to sufficiently deaerate the sheet material 11 passing through the vacuum space 15.

The inlet unit 13 has an inlet casing 17 fixedly mounted on the top wall of the vacuum chamber 12 in airtight manner. The inlet casing 17 is formed in a rectangular shape opened on top and bottom sides, and accommodates therein pinch rolls 18 and 19 pivotably supported between the inner walls at both ends to hold the sheet material 11 in an airtight manner between the rolls. One pinch roll 18 is made of a metal, while the other pinch roll 19 is made of a rubber layer secured on a metallic core. The inlet casing 17 is provided at both ends with side sealing members 20 and 21 which are respectively hollow to be preferably made expandable at four vertical walls thereof and provided with a fluid inlet 22 or 23. Further, these side sealing members 20 and 21 are respectively formed substantially in T shape in side elevation so as to be positioned straddling across both endwise extending shafts of the pinch rolls 18 and 19 and abutting at outer side wall and both longitudinal end walls against the inner walls at each end wall and adjacent portions of the side walls of the casing 17. A suitable fluid is supplied under a pressure into the side sealing members 20 and 21 so that their expandable vertical walls will come into tight contact with the inner walls at both longitudinal end parts of the inlet casing 17 and the airtightness will be achieved highly excellently at these end parts.

The inlet unit 13 further comprises lip sealing members 24 and 25 which are L-shaped in section and disposed longitudinally across the both side sealing members 20 and 21 to airtightly abut at their vertical plate parts against the inner side walls of the inlet casing 17 immediately above the pinch rolls 18 and 19 and to pressingly contact at their both longitudinal ends against opposing inner side walls of the side sealing members 20 and 21 specifically when the latter are expanded. Fixedly attached to opposing edges of horizontal plate parts of the lip sealing members 24 and 25 are resilient edge members 26 and 27 horizontally extended all over the length of the edges, to be disposed to closely oppose each other. Since the resilient members 26 and 27 are subjected at their top surface to the higher ambient atmospheric pressure and at their bottom surface to a lower pressure within the vacuum chamber 12, the resilient members 26 and 27 are tightly brought into contact longitudinally with the circumferential surfaces of the pinch rolls 18 and 19 substantially over the entire length between the both side sealing members 20 and 21. Accordingly, it will be appreciated that the side sealing members 20 and 21, lip sealing members 24 and 25 and resilient edge members 26 and 27 are realizing an excellent airtight seal at the inlet unit 13 except for mutual contacting surface area of the pinch rolls 18 and 19.

Figure 3:
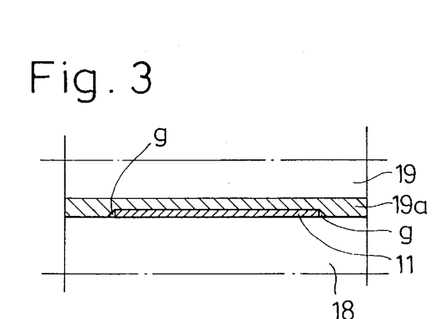
FIGS. 3 to 5 are diagrams for explaining the inlet unit of FIG. 2.
Figure 4:
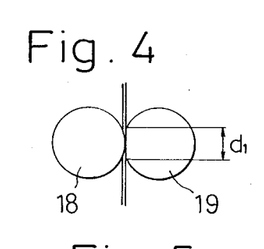
Figure 5:
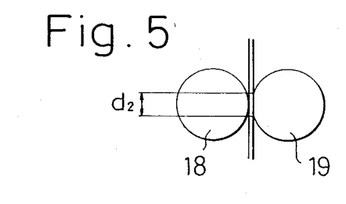

In addition, in the inlet unit 13, the pinch roll 19 is urged into engagement with the opposing pinch roll 18 by means of air cylinders 28 and 29 provided outside the casing 17 and acting on both shaft ends of the roll 19 extended out of the casing, and it will be appreciated that the pinch pressure under which the sheet material 11 is held between the rolls 18 and 19 and passed therethrough can be properly varied by changing the air pressure fed to the cylinders 28 and 29. The rubber layer on this pinch roll 19 has a rubber hardness of preferably 65 to 70, in particular, 68. Referring to the reason therefor with reference to FIGS. 3 to 5, when a rubber layer 19a on the pinch roll 19 has a relatively high hardness of over 70, the rubber layer 19a does not sufficiently expand even when resiliently depressed by the sheet material 11 introduced between the pinch rolls 18 and 19, which results in the formation of gaps "g" between the rolls 18 and 19 along both side edges of the material 11 to deteriorate the airtightness of the vacuum chamber 12. When the hardness of the rubber layer is lower than 65, on the other hand, it becomes inevitable that the hardness fluctuates at different positions of the rubber layer circumferentially fixedly mounted on the metallic core to form the roll 19, and this tendency is increased as the rubber hardness is decreased. Therefore, for example, a contact zone $d_1$ of the both rolls 18 and 19 with the sheet material 11 disposed therebetween becomes large on both end sides of the rolls 18 and 19 (refer to FIG. 4), whereas a contact zone $d_2$ of the rolls 18 and 19 with the sheet material 11 becomes small at the middle parts of the rolls 18 and 19 (refer to FIG. 5). As a result, the sheet material 11 passing between the pinch rolls 18 and 19 is subjected to different feed speeds at both side edge parts and middle part of the material, so that extremely unfavorable wrinkles will take place in the sheet material 11. The present inventors have conducted a variety of tests in this respect and have found that the hardness of the rubber layer 19a is set to be optimumly at the foregoing value.

The outlet unit 14 comprises an outlet casing 30 fixedly mounted on the top wall of the vacuum chamber 12 independently of the inlet unit 13, and may have the same arrangement as that of the inlet unit 13. Defined within the outlet unit 14 with a pair of pinch rolls 31 and 32 and a pair of lip sealing members 33 and 34 abutting against the rolls 31 and 32 is an upper partition chamber which is filled with a resin varnish to form an impregnating bath 35. Thus the strip sheet material 11 which has been deaerated within the vacuum chamber 12 and delivered out of the pinch rolls 31 and 32 is passed through the impregnating bath 35 and impregnated with the resin varnish immediately before being exposed to the ambient air. In this case, it will be understood that the sheet material 11 is quickly and uniformly impregnated with the resin varnish due to the pressure difference between the ambient atmosphere and the reduced pressure in the vacuum space 15. In the outlet unit 14, further, the opened top side of the outlet casing 30 is liquid sealed by the impregnating bath 35, and an excellent air tight seal is provided to the vacuum chamber 12.

The strip material 11 wound in a roll on a turret 36 is paid out and led into the vacuum chamber 12 through guide rolls 37 to 39. The sheet material 11 passed through the inlet unit 13 of the vacuum chamber 12 is guided through guide rolls 41 and 42 so as to run a relatively long distance within the chamber 12. The sheet material 11 is then guided through the pinch rolls 31 and 32 into the impregnating bath 35 to be impregnated with the resin varnish. The thus resin-impregnated sheet material 11 is passed through squeeze rolls 43 and 44 disposed closely above the outlet unit 14 to adjust the impregnated resin content, and is thereafter sent to a dryer 46 incorporating an infrared ray lamp 45 to be thereby heated and dried. The strip sheet material 11 is then cut into a desired size to obtain the resin-impregnated sheet materials.

Figure 6:
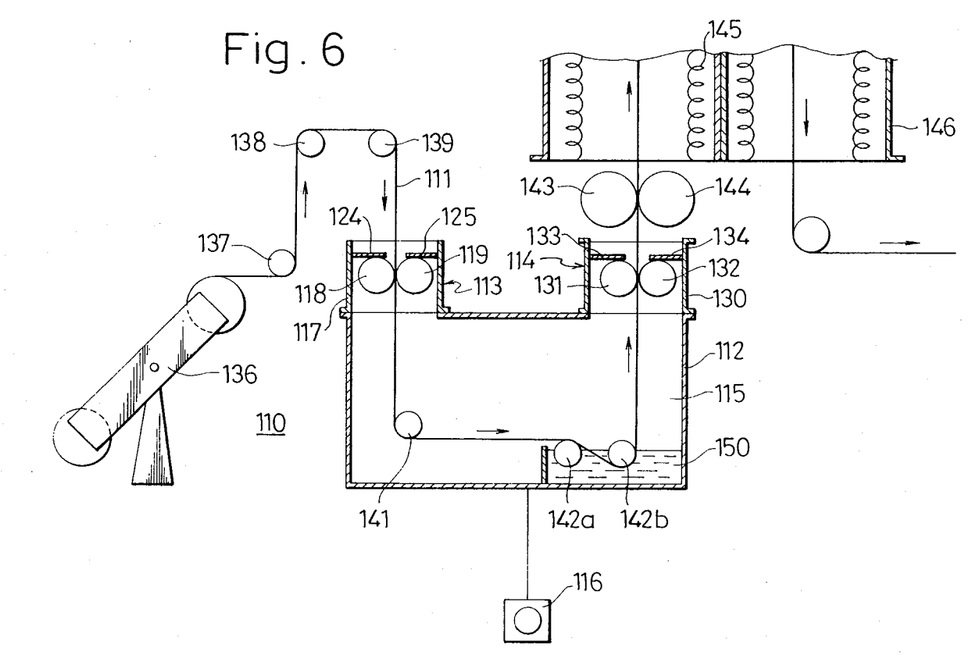
FIG. 6 is a schematic diagram in another embodiment of the apparatus according to the present invention, wherein a dip bath for the resin-varnish impregnation is provided within a vacuum chamber.

Referring to another embodiment shown in FIG. 6 of the manufacturing apparatus 110 according to the present invention, the same members as those in the foregoing embodiment of FIGS. 1 and 2 are denoted by the same reference numerals but added by 100. The present embodiment is different from the foregoing embodiment in that no resin-varnish impregnating bath is provided in the outlet unit 114 of the vacuum chamber 112 but a dip bath 150 of resin varnish is provided within the vacuum space 115 of the vacuum chamber 112. In the present embodiment, the strip-shaped sheet material 111 is passed through the pinch rolls 118 and 119 at the inlet unit 113, guide roll 141 and a pair of guide rollers 142a and 142b which are partly dipped in the bath 150, so that the sheet material 111 will be quickly and uniformly impregnated with the resin varnish while being subjected to the lower pressure in the vacuum space 115 than the atmosphere. Otherwise, the arrangement and operation of the present embodiment are the same as those in the foregoing embodiment.

Figures 7, 8:
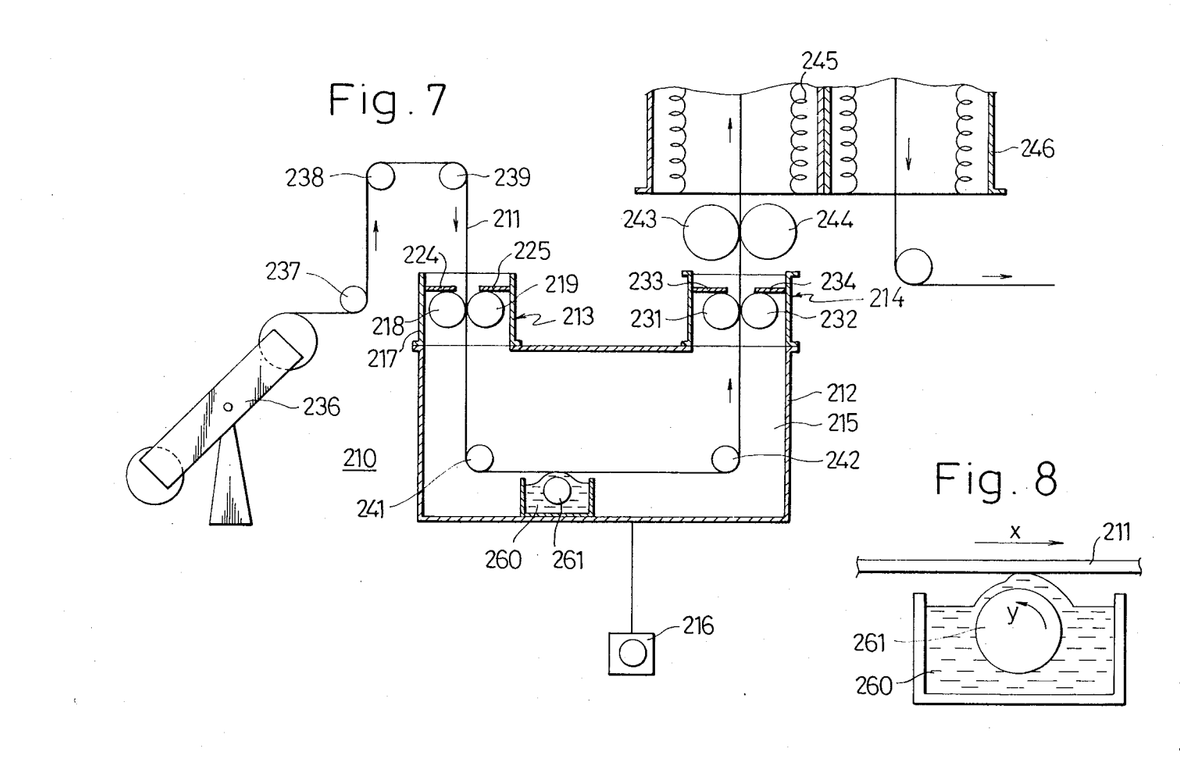
FIG. 7 is a schematic diagram in a further embodiment of the apparatus according to the present invention, wherein a roll coater for the resin-varnish impregnation is provided within the vacuum chamber.
FIG. 8 is a diagram for explaining the roll coater in the apparatus of FIG. 7.

Referring to a further embodiment as in FIG. 7 of the manufacturing apparatus 210 according to the present invention, the same members as those in the foregoing embodiment of FIGS. 1 and 2 are denoted by the same reference numerals but added by 200. The present embodiment is different from the foregoing embodiment in that no impregnating bath of resin varnish is provided in the outlet unit 214 of vacuum chamber 212 but a roll coater 260 for impregnation of resin varnish is provided within the vacuum space 215 in the chamber 212. In the present embodiment, the roll coater 260 is positioned below and close to the lower surface of the strip sheet material 211 guided between the guide rolls 241 and 242 within the vacuum chamber 212. The roll coater 260 comprises, as shown in FIG. 8, a dip roll 261 which rotates in a direction of an arrow "y" opposite to the feed direction of an arrow "x" of the sheet material 211 as spaced by a relatively small distance from the sheet 211 so that, when the sheet material 211 is fed in the "x" direction, the rotation of the dip roll 261 in the opposite "y" direction will cause the roll 261 itself to be not contacted directly with the sheet material 211 but only resin varnish on the roll 261 to be contacted with the lower surface of the material 211 to impregnate it. If the dip roll 261 were to be pressingly contacted with the sheet material 211, this pressing force would cause the resin varnish to reach the opposite upper surface of the sheet material through relatively rough or larger pores of the sheet, which would result in a failure of the varnish to penetrate into relatively fine pores in the sheet material, and air bubbles would tend to remain in the fine pores. According to the roll coater 260 of the present embodiment, however, the sheet material 211 is not pressingly contacted by the dip roll 261, so that only the pressure difference between the vacuum space 215 and the ambient atmosphere applied to the sheet material 211 within the vacuum space 215 will be contributive substantially to the resin-varnish impregnation into the sheet material 211 for its uniform impregnation without allowing any air bubbles to stay therein.

It has been already found that, when the sheet material is relatively thin, generally, there arises no substantial problem even when a pressing force is applied to the thin sheet material upon its resin-varnish impregnation as in the embodiment of FIG. 6, whereas the pressing force application during the resin-varnish impregnation onto a relatively thick sheet material causes more air bubbles to remain in the sheet material, but the use of the roll coater 260 as in the present embodiment is effective in removing such problem.

In the present embodiment, the dip roll 261 of the roll coater 260 can be coupled to an output shaft of a motor (not shown) extruded into the vacuum chamber 211 through a mechanical seal, the motor itself being mounted on the outer wall of the vacuum chamber 212. When it is necessary to shift the direction of the output shaft of the motor by an angle of 90 degrees to transmit the motor output power to the dip roll 261, a worm gear may be inserted into the power transmission path. It will be appreciated that the motor is preferably of a variable speed type, so that the amount of the resin-varnish impregnation into the sheet material 211 can be varied by changing the rotational speed of the motor and eventually of the dip roll 261. Other arrangement and operation of the embodiment of FIG. 7 are the same as those of the foregoing embodiment.

Figure 9:
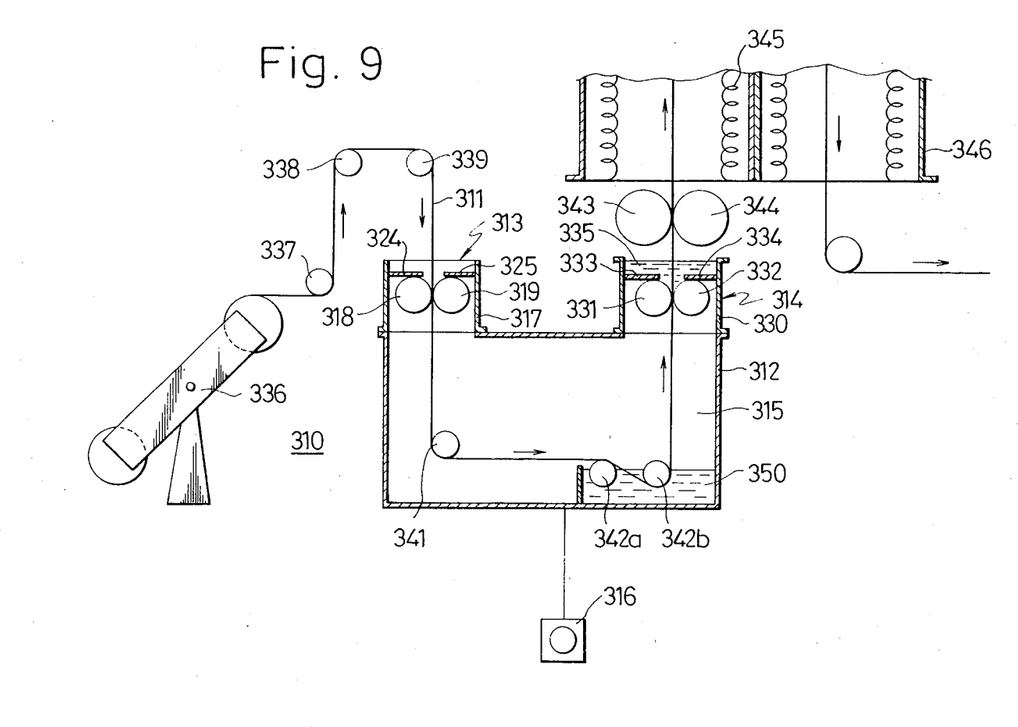
FIG. 9 is a schematic diagram in still another embodiment of the apparatus according to the present invention, wherein a resin-varnish impregnating means is provided at the outlet part and a dip bath for the impregnation is provided within the vacuum chamber.

Referring to FIG. 9 showing a sheet manufacturing apparatus 310 according to still another embodiment of the present invention, this apparatus generally corresponds to a combination of the embodiment of FIGS. 1 and 2 with that of FIG. 6 in respect of the arrangement for the resin-varnish impregnation of the sheet material. In FIG. 9, the same members as those in the embodiment of FIGS. 1 and 2 or FIG. 6 are denoted by the same reference numerals but added by 300 or 200. In the present embodiment, the sheet material 311 is first impregnated with the resin varnish in the dip bath 350 provided within the vacuum space 315 of the vacuum chamber 312 in the similar manner to the dip bath 150 of the embodiment of FIG. 6, and then, immediately after being discharged out of the vacuum chamber 312, the sheet material 311 is impregnated with the resin varnish in the impregnating bath 335 in the outlet unit 314 substantially in the same manner to the impregnating bath 35 of the embodiment of FIGS. 1 and 2. According to the present invention, the sheet material 311 can be impregnated with the resin varnish at two stages and the resin-varnish impregnation of the sheet 311 can be reliably and uniformly realized.

Figure 10:
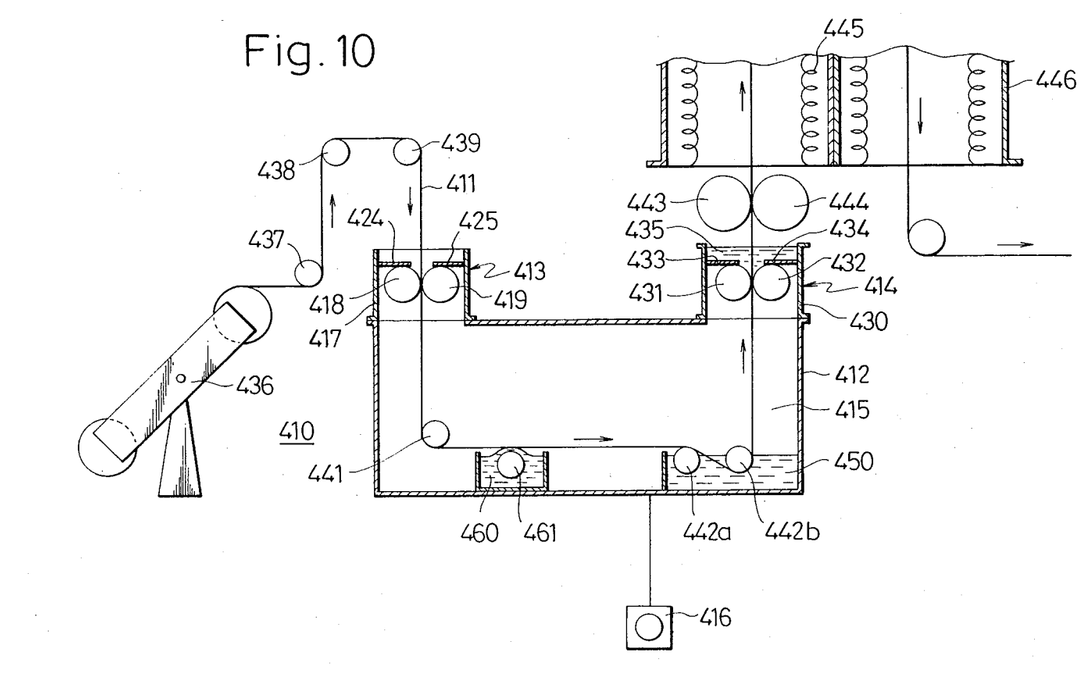
FIG. 10 is a schematic diagram in a still further embodiment of the apparatus according to the present invention, wherein a resin-varnish impregnating means is provided in the outlet while a roll coater and dip bath for the impregnation are provided within the vacuum chamber.

Shown in FIG. 10 is a manufacturing apparatus 410 according to a still further embodiment of the present invention, which is, in short, a combination of the manufacturing apparatuses of the embodiments respectively shown in FIG. 9 and FIGS. 7 and 8 with regard to the arrangement for the impregnation of the sheet material with the resin varnish. In FIG. 10, the same members as those of the embodiment of FIG. 9 or FIGS. 7 and 8 are denoted by the same reference numerals but added by 100 or 200. In the present embodiment, the sheet material 411 is first impregnated with the resin varnish in the roll coater 460 provided in the vacuum space 415 of the vacuum chamber 412 in the similar manner to the roll coater 260 in the embodiment of FIGS. 7 and 8, and is further subjected to the impregnation at the dip bath 450 also in the vacuum space as well as at the impregnating bath 435 of the outlet unit 414 in the similar manner to the embodiment of FIG. 9. According to the present embodiment, therefore, the sheet material 411 can be impregnated with the resin varnish at three stages in which the roll coater 460 is suitable when the sheet material 411 is thick as has been explained in connection with the embodiment of FIGS. 7 and 8, and the resin-varnish impregnation specifically of such thick sheet material 411 can be reliably and uniformly realized.

Figure 11:
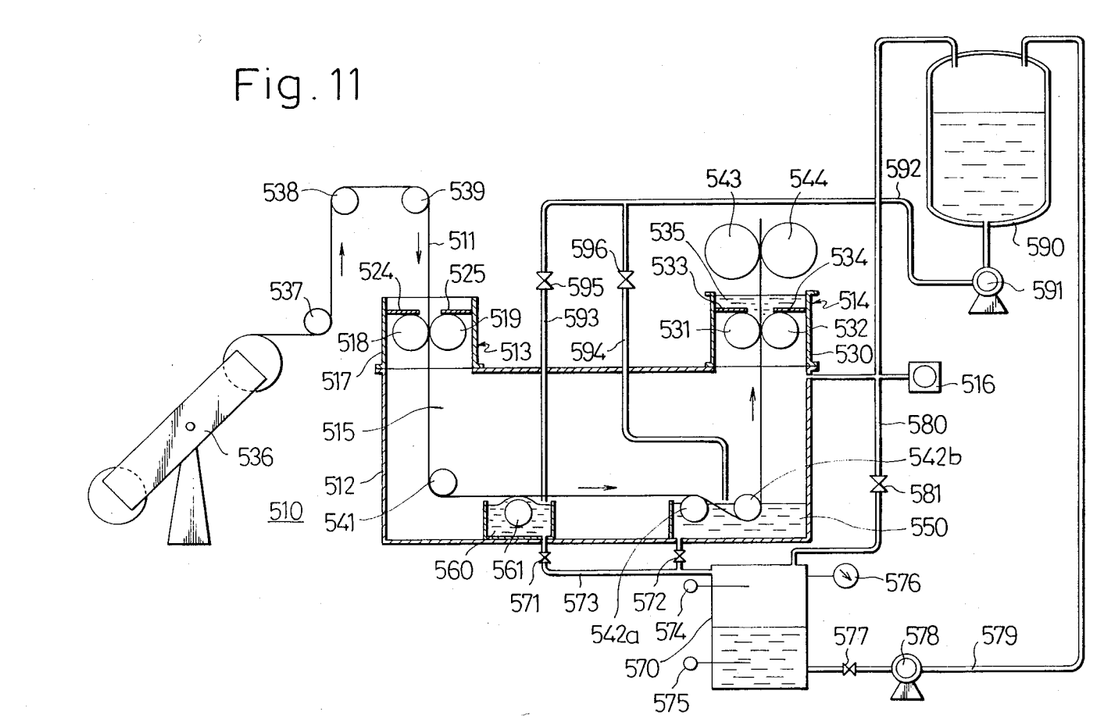
FIG. 11 is a schematic diagram in yet another embodiment according to the present invention, in which a resin-varnish supplying and discharging system is added to the apparatus of FIG. 10.

Referring to a manufacturing apparatus 510 of FIG. 11 according to yet another embodiment of the present invention, an arrangement for supplying and discharging the resin varnish is added to the embodiment of FIG. 10. In FIG. 11, the same members as those of the embodiment of FIG. 10 are denoted by the same reference numerals but added by 100. The apparatus 510 of the present embodiment further comprises a cushion tank 570 and a resin-varnish supply tank 590. The cushion tank 570 is coupled at the top part to an outlet pipe 573 which is branched respectively through valves 571 and 572 to the roll coater 560 and dip bath 550 provided in the vacuum space 515 of the vacuum chamber 512, while the cushion tank 570 is provided at the upper and lower part with upper and lower level sensors 574 and 575 respectively together with a pressure switch 576. The cushion tank 570 is also coupled at the lower part through a conduit having a valve 577 to an intake pump 578 communicating at its discharge port with upper interior part of the supply tank 590. A vacuum pump 516 for reducing the pressure within the vacuum chamber 512 communicates via a branch conduit 580 with the cushion tank 570 and also with the supply tank 590 so that spaces having the same pressure level as the vacuum chamber 512 are provided in the both tanks 570 and 590. In the illustrated embodiment, a valve 581 is inserted between the vacuum pump 516 and the cushion tank 570, and a valve may be provided as required between the vacuum pump 516 and the vacuum chamber 512 or between the vacuum pump 516 and the supply tank 590.

The supply tank 590 is coupled at its bottom to a supply pump 591 for supplying the resin varnish from the tank 590 through a conduit 592 to the impregnating positions inside the vacuum chamber. Thus, the conduit 592 is connected to branch conduits 593 and 594 provided therein with valves 595 and 596, and these branch conduits 593 and 594 are air-tightly led into the vacuum chamber 512 to reach the roll coater 560 and dip bath 550. Since the impregnating bath 535 provided at the outlet unit 514 of the vacuum chamber 512 is not placed in the vacuum atmosphere, the resin varnish supply to this impregnating bath 535 can be made by any known supplying means with, for example, a supply tank incorporating a float valve and attached directly to the impregnating bath 535.

In the present embodiment, the resin varnish can be supplied to and discharged from the roll coater 560 and the dip bath 550 without in particular opening or closing the vacuum chamber 512. Now, in supplying the resin varnish to the roll coater 560 and dip bath 550, the valves 571, 572, 577 and 581 on the discharge side are closed, with the cushion tank 570 and intake pump 578 kept in their non-operative state, the supply pump 591 is driven with one or both of the valves 595 and 596 opened, the vacuum space 515 of the vacuum chamber 512 is thereby made to be at the same pressure level as the upper interior space of the supply tank 590 under the vacuum pump 516, and the resin varnish can be smoothly supplied from the supply tank 590 to one or both of the roll coater 560 and dip bath 550 through the conduit 592 and branch conduits 593 and 594 at the operating rate of the supply pump 591.

In discharging the resin varnish out of one or both of the roll coater 560 and dip bath 550, on the other hand, the valves 595 and 596 on the supply side are closed, the supply pump 591 is put in its non-operative state and one or both of the valves 571 and 572 are opened. Since the vacuum space 515 of the vacuum chamber 512 has been at the same pressure level as the top interior space of the cushion tank 570 under the operation of the vacuum pump 516, the resin varnish flows from one or both of the roll coater 560 and dip bath 550 through the conduit 573 to the cushion tank 570. When the level of the resin varnish in the cushion tank 570 exceeds the upper level sensor 574, then one or both of the valves 571 and 572 and 581 opened are now closed and, subsequently, a leak valve (not shown) preferably provided together with the pressure switch 576 and capable of drawing, for example, the ambient air is opened to elevate the pressure in the upper interior space of the cushion tank 570 to a set value of the pressure switch 576. Thereafter, the leak valve is closed, the intake pump 578 is driven while simultaneously opening the valve 577, the resin varnish in the cushion tank 570 is drawn into the supply tank 590 through the conduit 579 and, when the resin varnish level in the cushion tank 570 becomes lower than the lower level sensor 575, the valve 577 is closed while the intake pump 578 is put in its non-operative state, to complete one discharge cycle of the resin varnish.

As seen from the foregoing explanation, the use of the resin varnish supply and discharge system according to the present embodiment makes it possible to have the resin varnish supplied to and discharged from the roll coater 560 and/or the dip bath 550 without varying the pressure of the vacuum space 515. According to the present embodiment, on the other hand, the manufacturing modes of the respective embodiments shown in FIGS. 1 and 2, FIG. 6, FIGS. 7 and 8, FIG. 9 and FIG. 10 can be realized. That is, the entire system of the present embodiment of FIG. 11 can be put in the same manufacturing mode as in the embodiment of FIGS. 1 and 2 when all the resin varnish in the roll coater 560 and dip bath 550 is discharged any only the impregnating bath 535 at the outlet unit 514 is filled with the resin varnish; in the same manufacturing mode as in the embodiment of FIG. 6 when the resin varnish is discharged from the roll coater 560 and impregnating bath 535 but is supplied only to the dip bath 550; in the same manufacturing mode as in the embodiment of FIGS. 7 and 8 when the resin varnish is discharged out of the dip bath 550 and impregnating bath 535 but is supplied only to the roll coater 560; in the same manufacturing mode as in the embodiment of FIG. 9 when the resin varnish is discharged out of the roll coater 560 but is supplied to the dip bath 550 and impregnating bath 535; and in the same manufacturing mode as in the embodiment of FIG. 10 when the resin varnish is supplied to all of the roll coater 560, dip bath 550 and impregnating bath 535. In this manner, the present embodiment can be selectively put in the optimum mode, according to the desired thickness, material and so on of the sheet member.

Otherwise, the arrangement and operation of the present embodiment shown in FIG. 11 are the same as those of the foregoing embodiments. While the dryer has been omitted in FIG. 11 for simplicity of the drawing, the dryer can be installed in similar manner to the foregoing embodiments, so that the sheet discharged out of the outlet unit 514 and adjusted in resin content by a pair of squeeze rolls 543 and 544 will be led to the dryer.

In the respective foregoing embodiments, the feeding of the strip sheet material can be carried out by a take-up unit or the like means installed downstream of the sheet material being discharged, i.e., on the side of the dryer. As the sheet material itself, it may be possible to employ one of various materials, including such papers as kraft paper, linter paper and any other proper paper, such cloths as fiberglass woven cloth, fiberglass nonwoven cloth, nylon fiber woven cloth, nylon fiber nonwoven cloth, polyester fiber woven cloth, polyester nonwoven cloth, such alamido fiber woven cloth as "QUEBRA" made by DUPONT company, or alamido fiber nonwoven cloth. Further, the resin varnish may be one of various resin varnishes widely used for the laminate of printed wiring board, such as a thermosetting resin varnishes; such as thermoplastic resin varnishes as phenol resin, polyester resin, epoxy resin and polyimide resin varnishes; and the like.

Further, the present invention may be modified in various ways. For example, although the sheet material in the form of a strip has been disclosed as an example in the foregoing embodiments, the sheet materials may be the ones which are cut into a predetermined size and conveyed by a suitable conveyor to manufacture the resin-impregnated sheets. Further, the roll coater has been shown in FIGS. 7 and 8 as positioned on the lower side of the sheet material, but the roll coater may be positioned on the upper side of the sheet, or the impregnation may even be performed in the form of a shower instead of the roll-coating. Further, without the provision of the impregnating bath at the outlet unit of the vacuum chamber, the roll coater and dip bath may be provided in the vacuum space of the vacuum chamber, or the provisions of only the roll coater in the vacuum space and of the impregnating bath at the outlet unit may be sufficient, without the provision of the dip bath.

What is claimed as our invention is:

1. A method of manufacturing a resin-impregnated fibrous sheet material comprising the steps of preparing a vacuum space having mutually independent inlet and outlet means through which a sheet material is guided into and out of said vacuum space in an airtight manner, reducing the pressure in said vacuum space to a vacuum sufficiently different from the ambient atmospheric pressure outside the vacuum space for deaerating said sheet material, passing the sheet material into the vacuum space to deaerate the sheet material, impregnating said deaerated sheet material with a liquid resin, said impregnating step including at least the step of applying said varnish to only one side of said sheet material within said vacuum space without applying pressing forces to said sheet material, and drying the impregnated sheet material.

2. A method according to claim 1, wherein said impregnating step further includes the step of fully submersing said sheet material into a bath of resin within said vacuum space.

3. A method according to claim 2 including said resin is supplied to said vacuum space without varying the pressure in said vacuum space.

4. A method according to claim 2, wherein said impregnating step further includes the steps of applying resin to said sheet material outside of said vacuum space.

5. A method according to claim 1, wherein said impregnating step further includes applying resin to said sheet material outside of said vacuum space.

6. An apparatus for manufacturing a resin-impregnated fibrous sheet material comprising a vacuum chamber defining a vacuum space therein and having airtight inlet means and airtight outlet means, means for guiding a sheet material into said vacuum chamber, means for moving said sheet material within said vacuum chamber while guiding it over a predetermined distance between said inlet and outlet means, vacuum means coupled to said vacuum chamber for reducing the interior pressure of said vacuum space to a vacuum sufficiently different from the ambient atmospheric pressure outside the vacuum chamber for achieving a deaeration of the sheet material, impregnating means provided in association with said vacuum space for impregnating said deaerated sheet material with a liquid resin, said impregnating means including at least means within said vacuum space for applying resin to only one side of said sheet material without applying pressing forces to said sheet material and means for moving said sheet material along guide means provided inside and outside said vacuum chamber.

7. An apparatus according to claim 6, wherein said impregnating means includes a roll coater provided within said vacuum chamber to apply resin to one side of the sheet material without applying a pressing force thereto.

8. A method according to claim 7 including the step of rotating said roll coater counter to the direction of movement of said sheet material.

9. An apparatus according to claim 6, wherein said inlet means of said vacuum chamber comprises an inlet casing fixedly mounted on the vacuum chamber and opened at its top and bottom sides, a pair of pinch rolls pivotably supported in said inlet casing for holding therebetween said sheet material in an airtight manner, and means for proving an airtight seal between upper and lower parts of said pinch rolls.

10. An apparatus according to claim 9, wherein said means for providing an airtight seal comprises a pair of side sealing members each positioned to extend across shaft ends of said pair of pinch rolls at each end thereof, and a pair of lip-sealing members L-shaped in section and positioned between said pair of side sealing members, each of said lip-sealing members being joined at one side part of said L-shape to said inlet casing and provided along side edge of the other side part with a resilient member which is urged into contact with the top of opposing one of said pinch rolls due to said pressure difference between said vacuum space and the ambient atmospheric pressure.

11. An apparatus according to claim 10, wherein said side sealing members are hollow and expandable into close contact with the inner surface of said inlet casing, each of said side sealing members being provided with means for introducing a fluid medium into the side sealing member for expanding the latter.

12. An apparatus according to claim 6, wherein said impregnating means comprises three-stage impregnating sections including a roll coater disposed within said vacuum chamber for impregnating said sheet material with said resin varnish from one side of the sheet material without applying a pressing force thereto, a dip bath disposed also within the vacuum chamber through which the whole of the sheet material is passed, and an impregnating bath defined at said outlet means through which the whole of the sheet material is passed.

13. An apparatus according to claim 10, which further comprises means for urging one of said pair of pinch rolls against the other pinch roll with a variable urging force.

14. An apparatus according to claim 9, wherein said outlet means of said vacuum chamber is formed substantially in the same manner as said inlet means.

15. An apparatus according to claim 7, wherein said roll coater includes a dip roll disposed close to said one side of said sheet material moved within said vacuum chamber along said guide means, said dip roll being rotated in a direction opposite to moving direction of the sheet material in non-contact relation thereto while bringing only said resin varnish carried on the roll into contact with the one side of the sheet material.

16. An apparatus according to claim 12 which further comprises a system for supplying and discharging said resin varnish to said impregnating means for selectively operating at least one of said three-stage impregnating sections.

17. An apparatus according to claim 6, which further comprises means for adjusting the amount of said resin varnish made to impregnate therewith said sheet material, and means for drying the sheet material impregnated with the resin varnish at a subsequent stage of said outlet means of said vacuum chamber.

18. An apparatus according to claim 6, wherein said means for moving said sheet material is a take-up device provided downstream of said outlet means of said vacuum chamber with respect to moving direction of the sheet material.

* * * * *